United States Patent
Shao et al.

(10) Patent No.: US 8,912,555 B2
(45) Date of Patent: Dec. 16, 2014

(54) SEMICONDUCTOR LIGHT-EMITTING DEVICE

(71) Applicant: Phostek, Inc., Hsinchu (TW)

(72) Inventors: Shih-Feng Shao, New Taipei (TW); Heng Liu, Sunnyvale, CA (US); Jinn Kong Sheu, Tainan (TW)

(73) Assignee: Phostek, Inc., Hsinchu (TW)

( * ) Notice: Subject to any disclaimer, the term of this patent is extended or adjusted under 35 U.S.C. 154(b) by 70 days.

(21) Appl. No.: 13/862,166

(22) Filed: Apr. 12, 2013

(65) Prior Publication Data
US 2014/0054627 A1 Feb. 27, 2014

Related U.S. Application Data

(60) Provisional application No. 61/692,123, filed on Aug. 22, 2012.

(51) Int. Cl.
| | |
|---|---|
| *H01L 29/205* | (2006.01) |
| *H01L 25/075* | (2006.01) |
| *H01L 33/62* | (2010.01) |
| *H05B 33/08* | (2006.01) |
| *H01L 33/50* | (2010.01) |

(52) U.S. Cl.
CPC .............. *H01L 33/62* (2013.01); *H01L 25/075* (2013.01); *H01L 33/50* (2013.01); *H05B 33/0806* (2013.01); *H01L 2924/0002* (2013.01)
USPC .............................................. 257/91; 257/99

(58) Field of Classification Search
CPC ....... H01L 33/62; H01L 33/50; H01L 25/075; H01L 2924/0002
USPC ....................................................... 257/91, 99
See application file for complete search history.

(56) References Cited

U.S. PATENT DOCUMENTS

| | | | | |
|---|---|---|---|---|
| 7,279,723 | B2 * | 10/2007 | Matsumura et al. | 257/100 |
| 2008/0061314 | A1 * | 3/2008 | Liaw et al. | 257/99 |
| 2011/0291154 | A1 * | 12/2011 | Noichi et al. | 257/99 |
| 2012/0187430 | A1 * | 7/2012 | West et al. | 257/88 |
| 2013/0193453 | A1 * | 8/2013 | Donofrio et al. | 257/88 |

* cited by examiner

*Primary Examiner* — Trung Q Dang
(74) *Attorney, Agent, or Firm* — Huffman Law Group, PC

(57) ABSTRACT

A semiconductor light-emitting device includes a circuit board with a layout layer and a die bonding area. At least one positive endpoint, negative endpoint and function endpoint are disposed on the layout layer. At least one semiconductor light-emitting chip is disposed within the die bonding area, and is electrically coupled to the positive endpoint, the negative endpoint and the function endpoint to facilitate various connection configurations.

14 Claims, 9 Drawing Sheets

8S1P

SEMICONDUCTOR LIGHT-EMITTING DEVICE

BACKGROUND OF THE INVENTION

1. Field of the Invention

The present invention generally relates to a semiconductor light-emitting device, and more particularly to a semiconductor light-emitting device adaptable to various input voltages and/or capable of providing various luminous flux.

2. Description of Related Art

A conventional light-emitting diode (LED) device is commonly packaged by disposing multiple LED chips on a circuit board. The LED chips are connected by interconnecting lines to result in required series/parallel configurations. After being bonded on the circuit board, the LED chips are coupled to the positive end and the negative end of an input voltage of the circuit board.

According to the package structure of conventional LED devices, the LED chips need be subjected to complex interconnections to be adaptable to required input voltages (e.g., 110 or 220 volts) or capable of providing required luminous flux, therefore making the manufacture of the LED chips inflexible. As a result, whenever customers request a different input voltage/luminous flux, the manufacturer has to re-design the circuit board and re-arrange interconnections of the LED chips.

A need has thus arisen to propose a novel LED device that is adaptable to various input voltages and/or capable of providing various luminous flux, therefore facilitating flexible collaboration between the LED chips and the circuit board.

SUMMARY OF THE INVENTION

In view of the foregoing, it is an object of the embodiment of the present invention to provide a semiconductor light-emitting device with light-emitting chips coupled in series/parallel by various arrangements of at least one positive endpoint, negative endpoint and function endpoint of a circuit board, therefore making the semiconductor light-emitting device adaptable to various input voltages and/or capable of providing various luminous flux.

According to one embodiment, a semiconductor light-emitting device includes a circuit board having a layout layer and a die bonding area. At least one positive endpoint is disposed on the layout layer; at least one negative endpoint is disposed on the layout layer; and at least one function endpoint is disposed on the layout layer. At least one semiconductor light-emitting chip is disposed within the die bonding area and electrically coupled to the positive endpoint, the negative endpoint or the function endpoint to facilitate various connection configurations.

DETAILED DESCRIPTION OF THE INVENTION

Figure 1A:
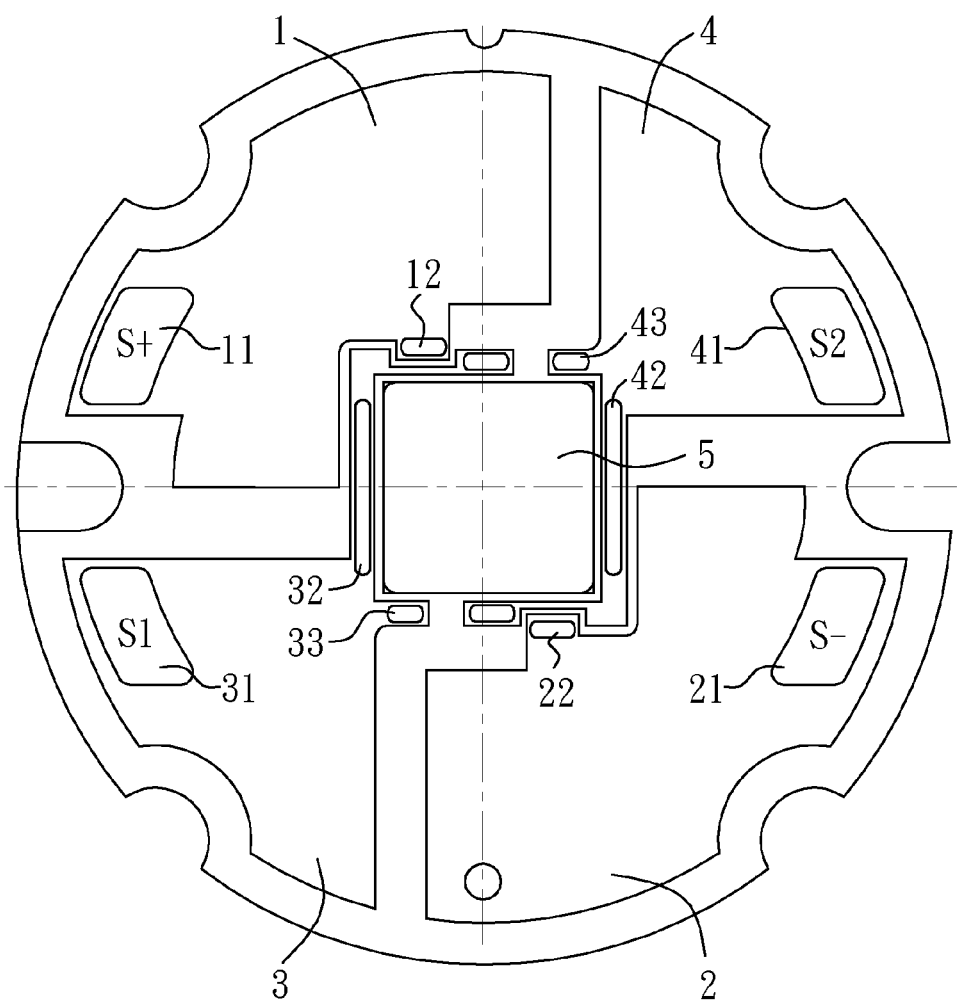
FIG. 1A shows a top view of a semiconductor light-emitting device according to one embodiment of the present invention.
Figure 1B:
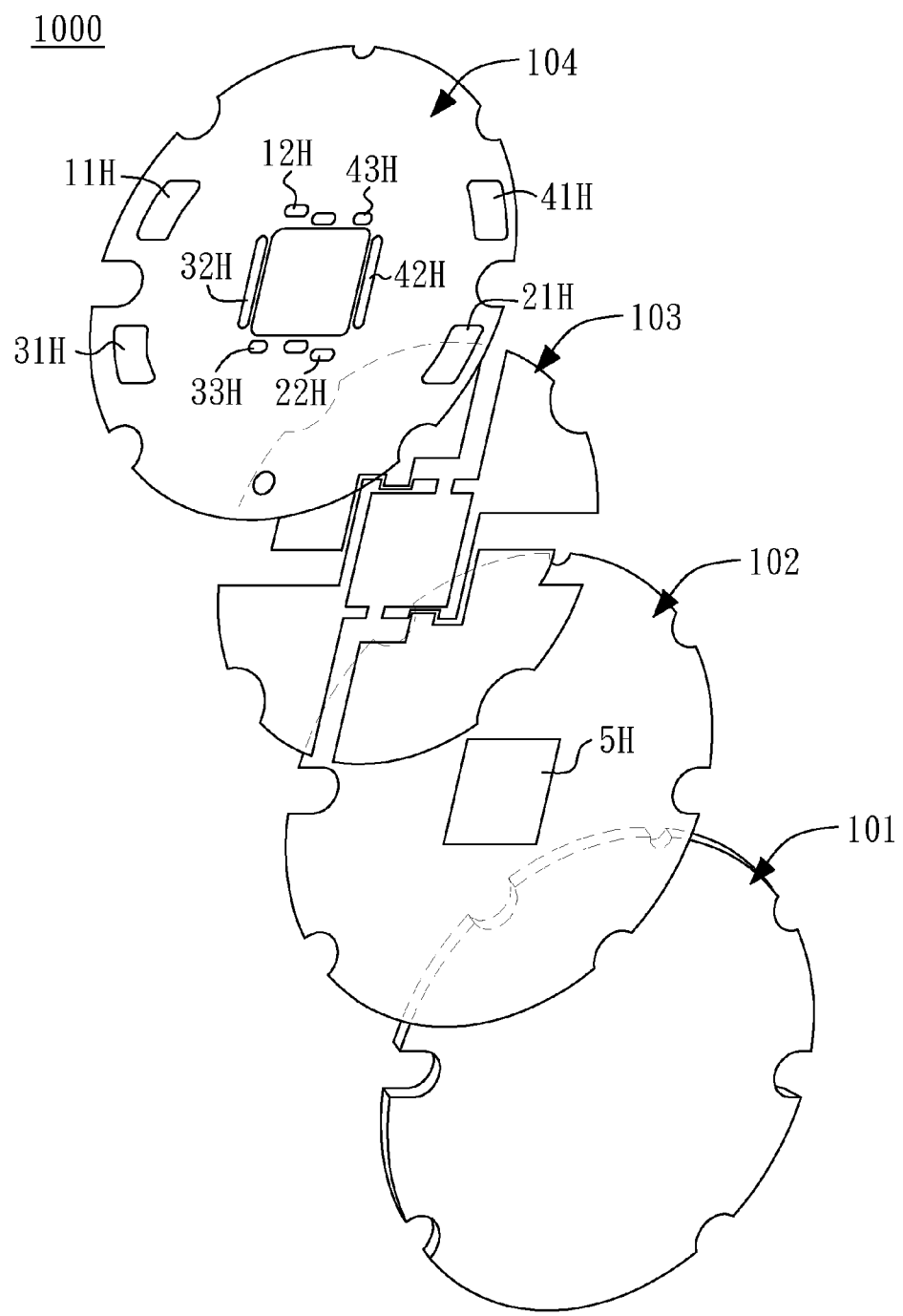
FIG. 1B shows an exploded view of FIG. 1A.

FIG. 1A shows a top view of a semiconductor light-emitting device according to one embodiment of the present invention, and FIG. 1B shows an exploded view of FIG. 1A. The semiconductor light-emitting device possesses a specific circuit layout adaptable to various input voltages and/or capable of providing various luminous flux.

As shown in FIG. 1B, the semiconductor light-emitting device of the embodiment primarily includes a circuit board 1000, for example, a metal-core printed circuit board (MCPCB), comprised of a metal substrate (as a metal core) 101, an insulating layer 102, a layout layer 103 and a cover layer 104, stacked from bottom to top. Although a circular circuit board 1000 is exemplified here, the circuit board 1000 may have other shapes instead.

In the embodiment, the metal substrate 101 may include aluminum or other metals. The insulating layer 102 may include resin (e.g., phenolic), epoxy, polyimide, polytetrafluorethylene (PTFE or TEFLON), bismaleimide triazine (BT), ceramic, aluminum oxide ($Al_2O_3$), aluminum nitride or silicon nitride. The layout layer 103 may include copper, gold or other metals. The cover layer 104 may include a resist ink layer.

A die bonding area opening 5H is correspondingly set (e.g., at a center) in the insulating layer 102, the layout layer 103 and the cover layer 104. The die bonding area opening 5H exposes a portion of the metal substrate 101 to define a die bonding area 5 (FIG. 1A), through which multiple semiconductor light-emitting chips, e.g., LED chips (not shown in FIG. 1A/1B), may be bonded on the metal substrate 101. According to one aspect of the embodiment, the circuit board 1000 may include a positive layout area 1, a negative layout area 2 and at least one function layout area (e.g., a first function layout area 3 and a second function layout area 4 as shown). In the embodiment, the positive layout area 1 and the negative layout area 2 are disposed on two opposite sides of the die bonding area 5 respectively, and the first function layout area 3 and the second function layout area 4 are each disposed between the positive layout area 1 and the negative layout area 2.

In the positive layout area 1, a positive endpoint opening 11H is set on a periphery of the cover layer 104 to define a positive endpoint 11 (designated as S+) on the layout layer 103, the positive endpoint 11 being configured for coupling to a positive end of an external (alternating current/direct current) input voltage (not shown) or an electronic component (not shown), such as integrated circuits (ICs), printed electronics or passive components. Moreover, at least one inner positive endpoint opening 12H is set near the die bonding area 5 of the cover layer 104 to define at least one inner positive endpoint 12 configured for coupling to the semiconductor light-emitting chips.

Similarly, in the negative layout area 2, a negative endpoint opening 21H is set on a periphery of the cover layer 104 to define a negative endpoint 21 (designated as S−) on the layout layer 103, the negative endpoint 21 being configured for coupling to a negative end of the external input voltage (not shown) or an electronic component (not shown), such as integrated circuits (ICs), printed electronics or passive components. Moreover, at least one inner negative endpoint opening 22H is set near the die bonding area 5 of the cover layer 104 to define at least one inner negative endpoint 22 configured for coupling to the semiconductor light-emitting chips.

In the first function layout area 3, a first function endpoint opening 31H is set on a periphery of the cover layer 104 to define a first function endpoint 31 (designated as S1) on the layout layer 103, the first function endpoint 31 being configured for coupling, for example, to a function endpoint 41 or an electronic component (not shown), such as integrated circuits (ICs), printed electronics or passive components. Moreover, at least one inner function endpoint opening 32H, including a first elongated pad opening, is set near the die bonding area 5 of the cover layer 104 to define a first elongated pad 32 (or an inner function endpoint) configured for coupling to the semiconductor light-emitting chips in series or in parallel. A first shortened pad opening 33H, is set near the die bonding area 5 of the cover layer 104 to define a first shortened pad 33 configured for coupling to the semiconductor light-emitting chips. The first shortened pad 33 may be used as a tapped point in the embodiment.

Similarly, in the second function layout area 4, a second function endpoint opening 41H is set on a periphery of the cover layer 104 to define a second function endpoint 41 (designated as S2) on the layout layer 103, the second function endpoint 41 being configured for coupling, for example, to a function endpoint 31 or an electronic component (not shown), such as integrated circuits (ICs), printed electronics or passive components. Moreover, at least one second elongated pad opening 42H, is set near the die bonding area 5 of the cover layer 104 to define a second elongated pad 42 (or an inner function endpoint) configured for coupling to the semiconductor light-emitting chips in series or in parallel. At least one second shortened pad opening 43H, is set near the die bonding area 5 of the cover layer 104 to define a second shortened pad 43 configured for coupling to the semiconductor light-emitting chips. The second shortened pad 43 may be used as a tapped point in the embodiment.

The light-emitting chip mentioned above may include group III nitride epitaxially formed on a sapphire ($Al_2O_3$) substrate. The group III nitride may include indium nitride (InN), gallium nitride (GaN), aluminum nitride (AlN), indium gallium nitride (InGaN) or indium aluminum gallium nitride (InAlGaN). In one embodiment, the light-emitting chip may further include LEDs having aluminum gallium indium phosphide (AlGaInP) formed on a gallium phosphide (GaP) substrate; indium gallium arsenide (InGaAs) formed on a gallium arsenide (GaAs) substrate; aluminum gallium arsenide (AlGaAs) formed on a gallium arsenide (GaAs) substrate; or silicon carbide (SiC) formed on a silicon carbide (SiC) or sapphire substrate. The light-emitting chip may include LEDs having group III-V material epitaxially formed on gallium arsenide (GaAs), silicon germanium (SiGe) formed on germanium (Ge), silicon carbide (SiC) formed on silicon (Si), aluminum oxide ($Al_3O_2$) formed on aluminum (Al) with a substrate of gallium nitride (GaN), indium nitride (InN), zinc oxide (ZnO), aluminum nitride (AlN), sapphire, glass, quartz or their combination. Alternatively, the light-emitting chip may include LEDs having group II-VI material epitaxially formed on a substrate. The substrates mentioned above may be removed from a final LED package.

FIG. 2A to FIG. 2D show connection configurations of an electronic component 200, the positive endpoint 11/negative endpoint 21 (i.e., S+/S−), the first function endpoint 31/second function endpoint 41 (i.e., S1/S2) of the circuit board 1000 (FIG. 1A/1B), the positive end V+/negative end V− of an external input voltage, and/or ground GND. The circuit board 1000 and the electronic component 200 may be electrically coupled via a metal line by directly coupling the positive endpoint 11/negative endpoint 21 (i.e., S+/S−) and the first function endpoint 31/second function endpoint 41 (i.e., S1/S2) of the circuit board 1000 to the electronic component 200; or alternatively by coupling an electrode of a cylindrical structure or a ball structure formed on the positive endpoint 11/negative endpoint 21 (i.e., S+/S−) and the first function endpoint 31/second function endpoint 41 (i.e., S1/S2) to the electronic component 200 in a flip chip manner; or alternatively by coupling the electrode of the cylindrical structure or a ball structure to a reserved position of the electronic component 200.

Figure 2A:
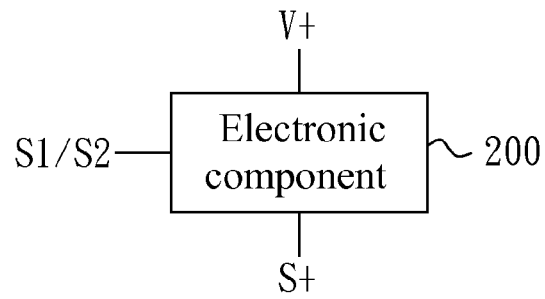
FIG. 2A to FIG. 2D show connection configurations of an electronic component, the positive/negative endpoint, the first/second function endpoint of the circuit board of FIG. 1A/1B, the positive/negative end of an external input voltage, and/or ground.
Figure 2B:
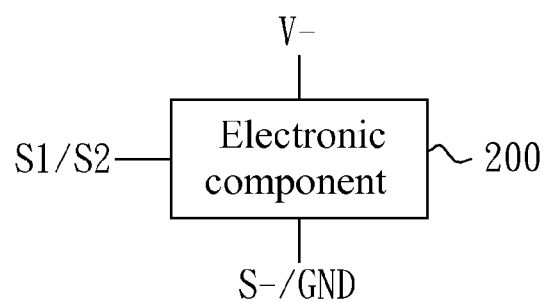
Figure 2C:
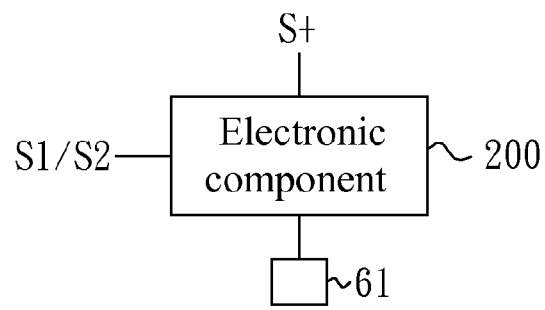
Figure 2D:
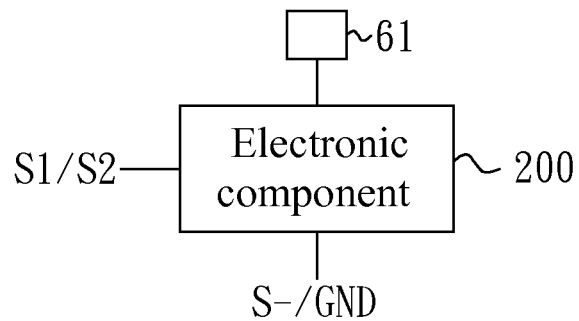

As shown in FIG. 2A, the electronic component 200 is electrically coupled to the positive end V+ of the external input voltage, to the positive endpoint 11 (i.e., S+) of the circuit board 1000, and, at the third point, to the first function endpoint 31/second function endpoint 41 (i.e., S1/S2). As shown in FIG. 2B, the electronic component 200 is electrically coupled to the negative end V− of the external input voltage, to the negative endpoint 21 (i.e., S−) or ground GND of the circuit board 1000, and, at the third point, to the first function endpoint 31/second function endpoint 41 (i.e., S1/S2). As shown in FIG. 2C, the electronic component 200 is disposed on the circuit board 1000, and is electrically coupled between the positive endpoint 11 (i.e., S+) and a semiconductor light-emitting chip 61 of the circuit board 1000, and, at the third point, to the first function endpoint 31/second function endpoint 41 (i.e., S1/S2). As shown in FIG. 2D, the electronic component 200 is disposed on the circuit board 1000, and is electrically coupled between the semiconductor light-emitting chip 61 and the negative endpoint (S−) 21/ground GND of the circuit board 1000, and, at the third point, to the first function endpoint 31/second function endpoint 41 (i.e., S1/S2).

Figure 3A:
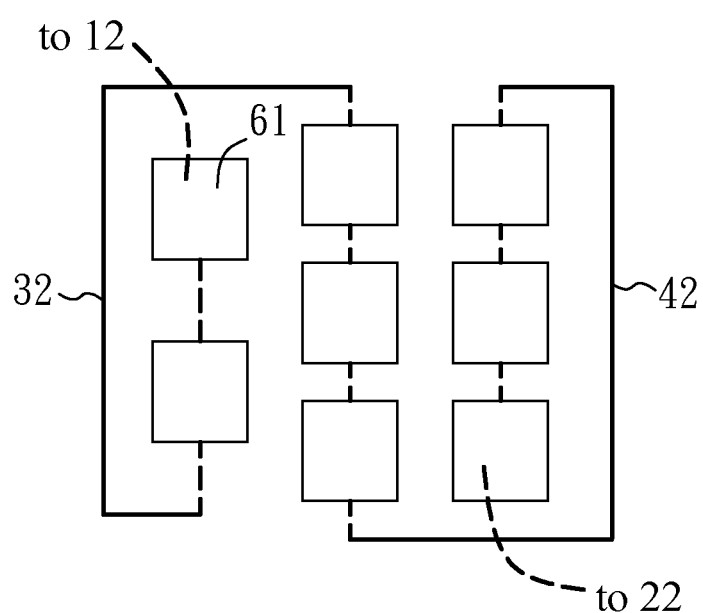
FIG. 3A to FIG. 3E shows connection configurations of the semiconductor light-emitting chips, the first/second elongated pad, and the inner positive/negative endpoint.
Figure 3B:
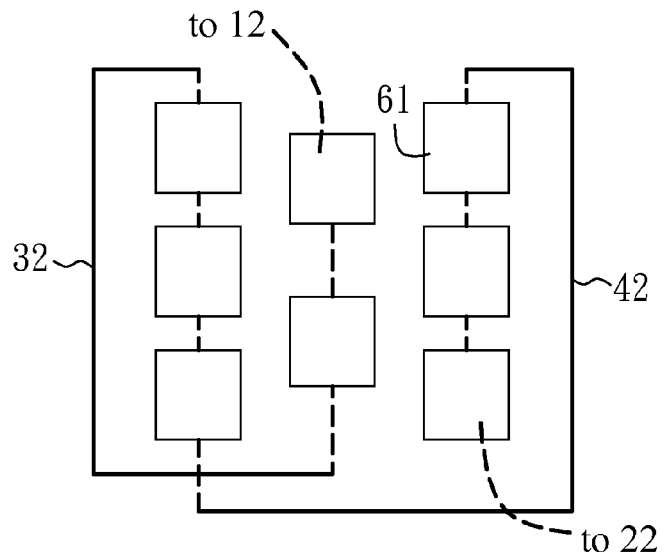

FIG. 3A to FIG. 3E shows connection configurations of the semiconductor light-emitting chips 61, the first elongated pad 32/second elongated pad 42, and the inner positive endpoint 12/inner negative endpoint 22. As shown in FIG. 3A, eight semiconductor light-emitting chips 61 are connected in series (called 8S1P) by the first elongated pad 32 (designated as solid line), the second elongated pad 42 (designated as solid line), and interconnecting lines (designated as dashed line). If each semiconductor light-emitting chip 61 has an operating voltage of 15 volts, the semiconductor light-emitting chips 61 connected as shown in FIG. 3A may be adapted to an input voltage of 110 volts. In other words, the semiconductor light-emitting chips 61 connected in series have a total operating voltage (15*8=120) greater than or equal to the input voltage (110 volts). Generally speaking, an adaptable input voltage has a value proportional to a product of the operating voltage of the semiconductor light-emitting chip 61 and the number of series-connected semiconductor light-emitting chips 61. Moreover, a target luminous flux has a value proportional to a product of the area of the semiconductor light-emitting chip 61 and the number of semiconductor light-emitting chips 61. FIG. 3B shows a similar 8S1P connection configuration.

Figure 3C:
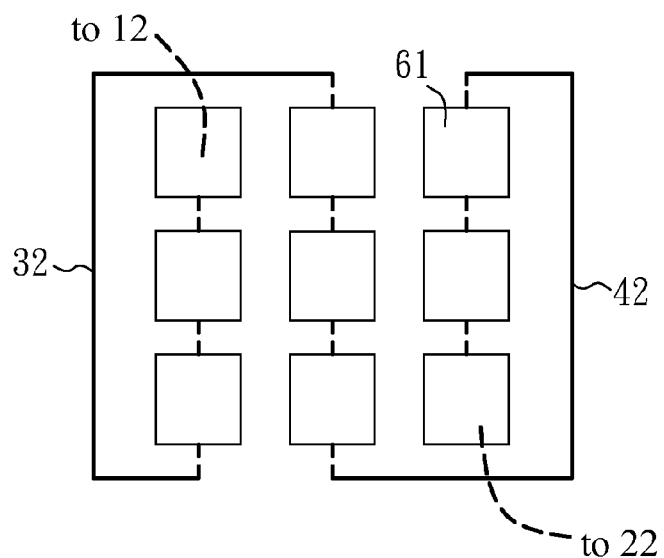

As shown in FIG. 3C, nine semiconductor light-emitting chips 61 are connected in series (called 9S1P) by the first elongated pad 32 (designated as solid line), the second elongated pad 42 (designated as solid line), and interconnecting lines (designated as dashed line). If each semiconductor light-emitting chip 61 has an operating voltage of 27 volts, the semiconductor light-emitting chips 61 connected as shown in FIG. 3C may be adapted to an input voltage of 220 volts.

Figure 3D:
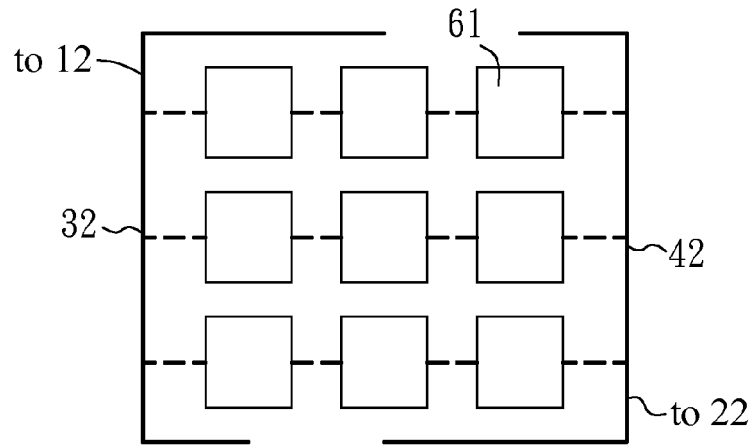

As shown in FIG. 3D, nine semiconductor light-emitting chips 61 are connected in 3S3P connection configuration having three parallel-connected strings each is comprised of three series-connected semiconductor light-emitting chips 61. The nine semiconductor light-emitting chips 61 are connected by the first elongated pad 32 (designated as solid line), the second elongated pad 42 (designated as solid line), and interconnecting lines (designated as dashed line). If each semiconductor light-emitting chip 61 has an operating voltage of 32 volts, the semiconductor light-emitting chips 61 connected as shown in FIG. 3D may be adapted to an input voltage of 110 volts.

Figure 3E:
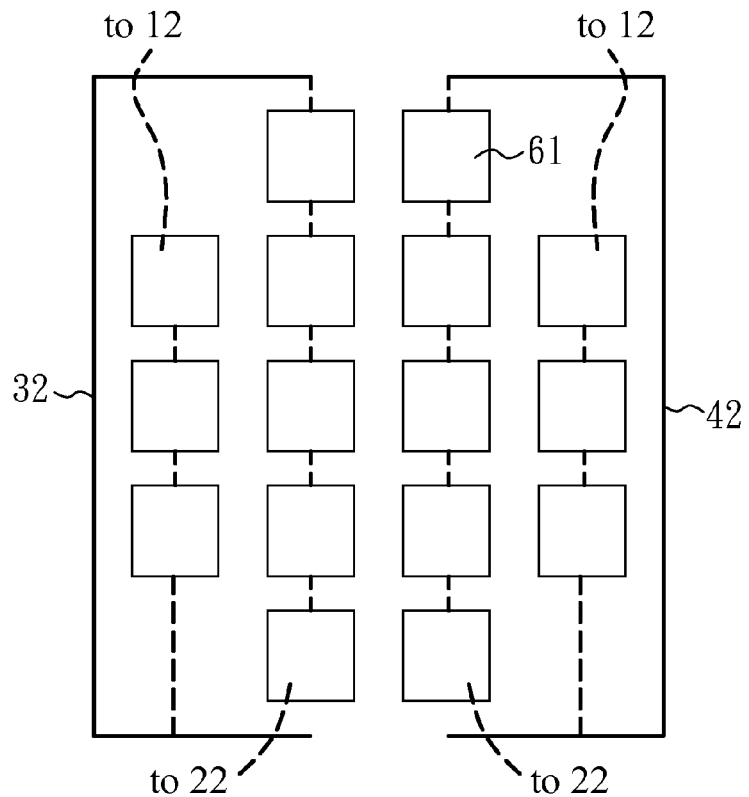

As shown in FIG. 3E, sixteen semiconductor light-emitting chips 61 are connected in 8S2P connection configuration having two parallel-connected strings each is comprised of eight series-connected semiconductor light-emitting chips 61. The sixteen semiconductor light-emitting chips 61 are connected by the first elongated pad 32 (designated as solid line), the second elongated pad 42 (designated as solid line), and interconnecting lines (designated as dashed line). If each semiconductor light-emitting chip 61 has an operating voltage of 15 volts, the semiconductor light-emitting chips 61 connected as shown in FIG. 3D may be adapted to an input voltage of 110 volts.

According to the connection configurations shown in FIG. 3A to FIG. 3E, the semiconductor light-emitting chips 61 may be connected in series/parallel to result in various connection configurations by the interconnecting lines (designated as dashed line), and in particular, the positive endpoint (S+) 11/negative endpoint (S−) 21 and the first/second function endpoint 31/41 (S1/S2), to be adaptable to various input voltages and/or capable of providing various luminous flux. In one embodiment, the semiconductor light-emitting chips 61 maybe stacked, for example, in epitaxy stacking or bonding stacking.

Figure 4:
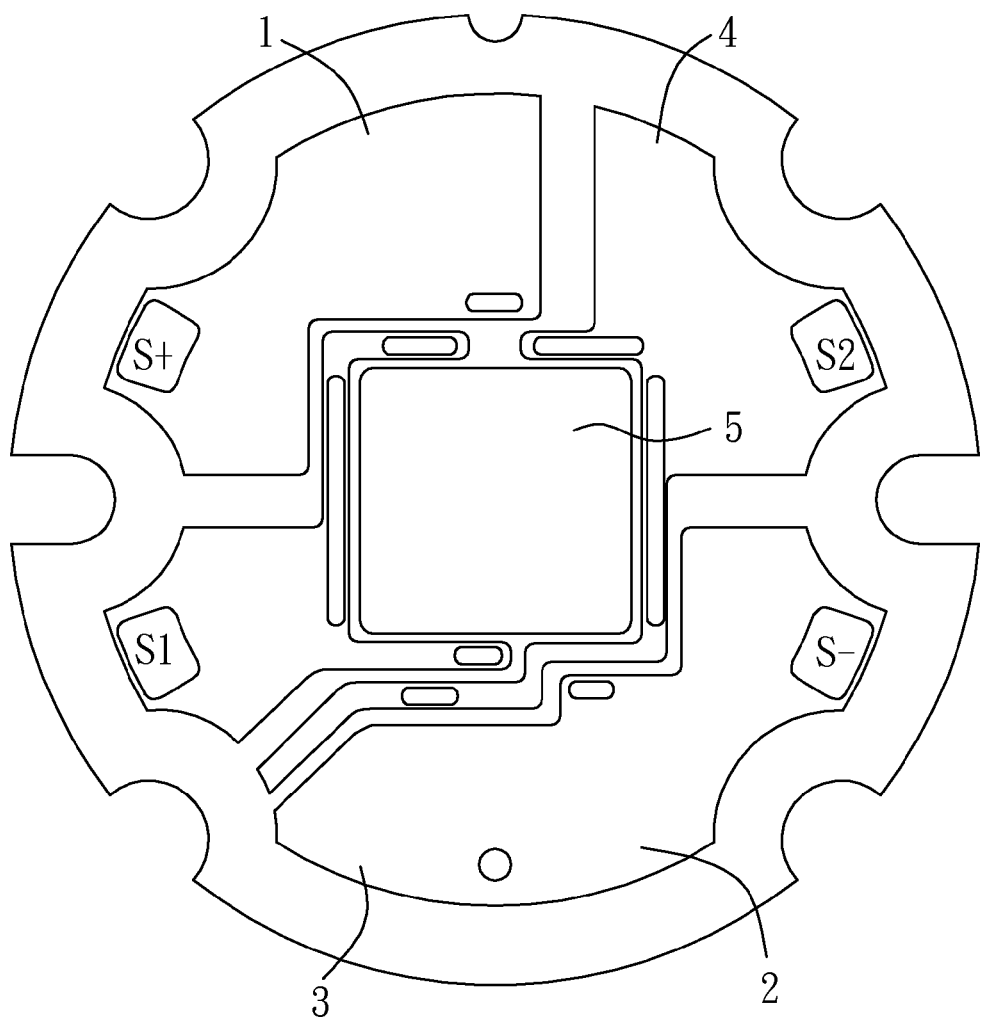
FIG. 4 shows a modified circuit board of the semiconductor light-emitting device.
Figure 5:
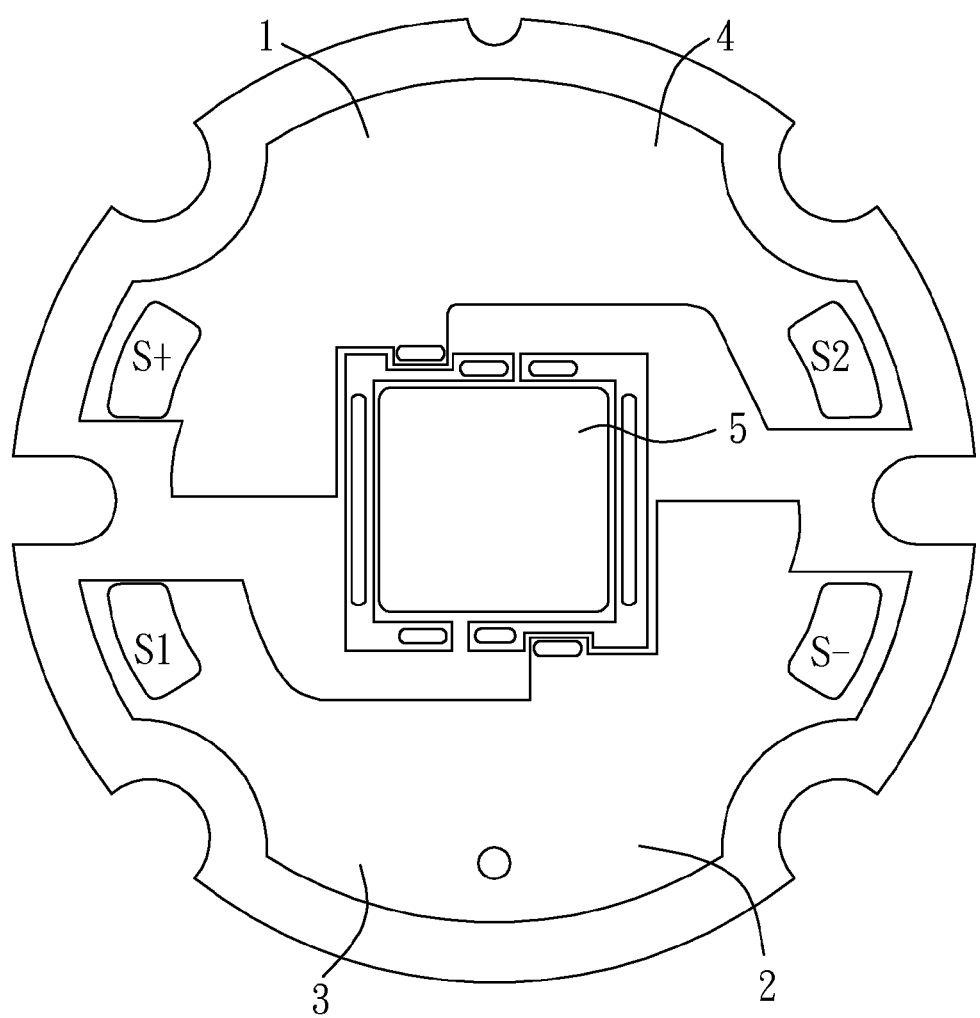
FIG. 5 further shows a modified circuit board of the semiconductor light-emitting device.

The circuit board 1000 of the embodiment shown in FIG. 1A/1B may be equivalently modified. FIG. 4 shows a modified circuit board 2000 of the semiconductor light-emitting device, similar to FIG. 1A, having a positive layout area 1, a negative layout area 2, a first function layout area 3 and a second function layout area 4. FIG. 5 further shows another modified circuit board 3000 of the semiconductor light-emitting device, wherein there is no physical boundary between a positive layout area 1 and a second function layout area 4, and no physical boundary between a negative layout area 2 and a first function layout area 3.

Figure 6:
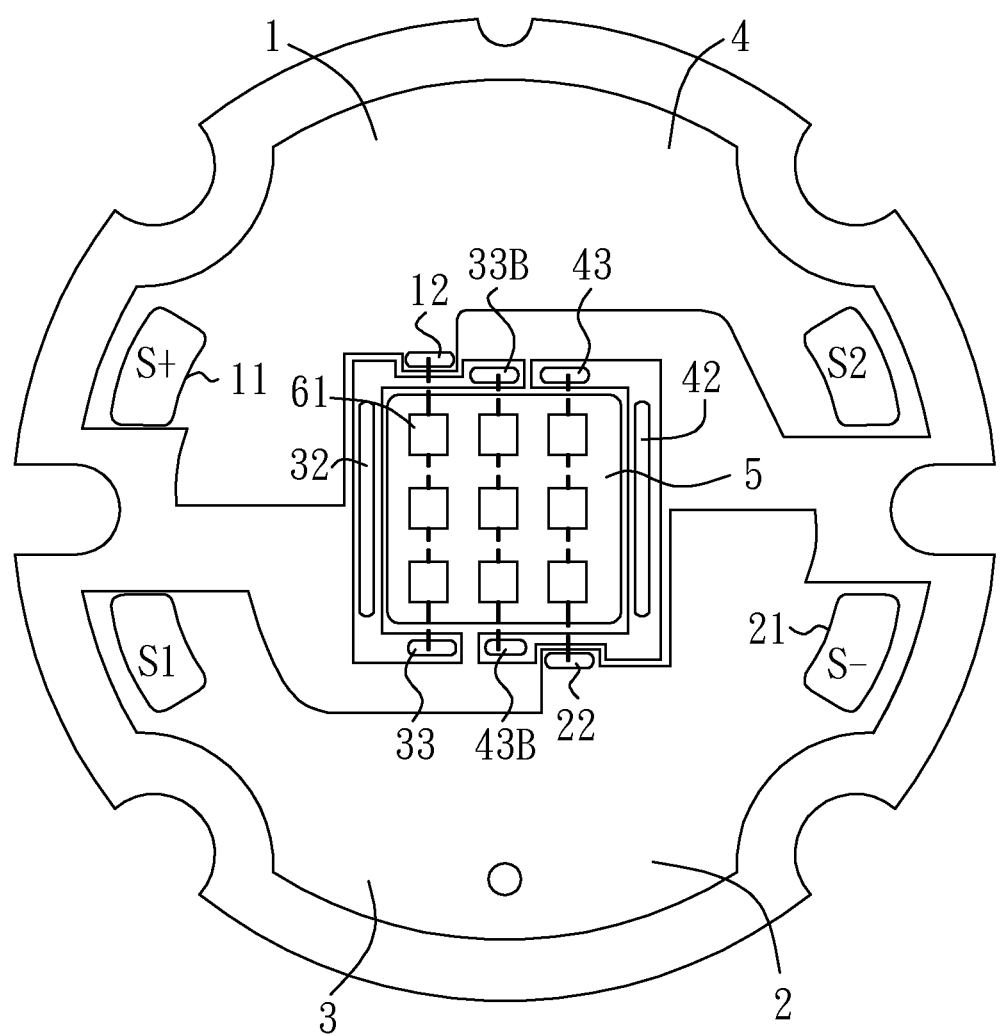
FIG. 6 shows a semiconductor light-emitting device that includes the circuit board of FIG. 5 and the connection configuration of FIG. 3C.

The circuit boards, for example, 1000, 2000 or 3000 shown above, may be collaborated with a variety of connection configurations (FIG. 3A to FIG. 3E) to form the semiconductor light-emitting device. FIG. 6 shows a semiconductor light-emitting device that includes the circuit board 3000 of FIG. 5 and the 9S1P connection configuration of FIG. 3C. Specifically, the left-hand string of three series-connected semiconductor light-emitting chips 61 has its top end electrically coupled to the positive endpoint 11 (i.e., S+) via the inner positive endpoint 12, and has its bottom end electrically coupled to a top end of the middle string of three series-connected semiconductor light-emitting chips 61, via the first shortened pad 33, the first elongated pad 32 and a shortened pad 33B. The middle string of three series-connected semiconductor light-emitting chips 61 has its bottom end electrically coupled to a top end of right-hand string of three series-connected semiconductor light-emitting chips 61, via a shortened pad 43B, the second elongated pad 42 and the second shortened pad 43. The right-hand string of three series-connected semiconductor light-emitting chips 61 has its bottom end electrically coupled to the negative endpoint 21 (i.e., S−) via the inner negative endpoint 22.

Although specific embodiments have been illustrated and described, it will be appreciated by those skilled in the art that various modifications may be made without departing from the scope of the present invention, which is intended to be limited solely by the appended claims.

What is claimed is:

1. A semiconductor light-emitting device, comprising:
   a circuit board having a layout layer and a die bonding area;
   at least one positive endpoint disposed on the layout layer;
   at least one negative endpoint disposed on the layout layer;
   at least one function endpoint disposed on the layout layer; and
   at least one semiconductor light-emitting chip, disposed within the die bonding area and electrically coupled to the positive endpoint, the negative endpoint or the function endpoint to result in various electrical connection configurations.

2. The semiconductor light-emitting device of claim 1, wherein the at least one semiconductor light-emitting chip comprises a plurality of light-emitting diodes (LEDs) that are electrically coupled in series, in parallel or in series-parallel combination, thereby being adaptable to various input voltages and/or capable of providing various luminous flux.

3. The semiconductor light-emitting device of claim 2, wherein the semiconductor light-emitting chips are stacked.

4. The semiconductor light-emitting device of claim 1, wherein the circuit board comprises a metal-core printed circuit board.

5. The semiconductor light-emitting device of claim 1, wherein the circuit board further comprises:
   an insulating layer disposed below the layout layer;
   a metal substrate disposed below the insulating layer; and
   a cover layer disposed above the layout layer;
   wherein a die bonding area opening is correspondingly set in the insulating layer, the layout layer and the cover layer to expose a portion of the metal substrate to define the die bonding area.

6. The semiconductor light-emitting device of claim 5, wherein the insulating layer comprises resin, ceramic, aluminum oxide ($Al_2O_3$), aluminum nitride or silicon nitride.

7. The semiconductor light-emitting device of claim 5, wherein the cover layer comprise a resist ink layer.

8. The semiconductor light-emitting device of claim 1, wherein the layout layer comprises:
   a positive layout area, within which the positive endpoint is disposed;
   a negative layout area, within which the negative endpoint is disposed; and
   at least one function layout area, within which the function endpoint is disposed.

9. The semiconductor light-emitting device of claim 8, in the positive layout area, wherein a positive endpoint opening is set on a periphery of the cover layer to define the positive endpoint on the layout layer, the positive endpoint being configured for coupling to a positive end of an external input voltage; and at least one inner positive endpoint opening is set near the die bonding area of the cover layer to define the inner positive endpoint configured for coupling to the semiconductor light-emitting chips.

10. The semiconductor light-emitting device of claim 8, in the negative layout area, wherein a negative endpoint opening is set on a periphery of the cover layer to define the negative endpoint on the layout layer, the negative endpoint being configured for coupling to a negative end of an external input voltage; and at least one inner negative endpoint opening is set near the die bonding area of the cover layer to define the inner negative endpoint configured for coupling to the semiconductor light-emitting chips.

11. The semiconductor light-emitting device of claim 8, in the function layout area, wherein at least one first function endpoint opening is set on a periphery of the cover layer to define the function endpoint on the layout layer, the function endpoint being configured for coupling to an electronic component or another function endpoint; and at least one inner function endpoint opening is set near the die bonding area of the cover layer to define the inner function endpoint configured for coupling to the semiconductor light-emitting chips.

12. The semiconductor light-emitting device of claim 8, wherein the at least one function layout area comprises a first function layout area and a second function layout area, the positive layout area and the negative layout area being disposed on two opposite sides of the die bonding area respectively, and the first function layout area and the second function layout area are each disposed between the positive layout area and the negative layout area.

13. The semiconductor light-emitting device of claim 1, wherein the function endpoint comprises a tapped point.

14. A package for a semiconductor light-emitting chip, the package comprising:
- a layout layer;
- a cover layer disposed over the layout later;
- a die bonding area disposed through openings in the cover layer and the layout layer; and
- a plurality of openings in the cover layer disposed around the die bonding area, the plurality of openings including:
    - at least one positive endpoint opening;
    - at least one negative endpoint opening;
    - at least one elongated openings; and
    - at least one short openings;
- wherein the plurality of openings facilitate a variety of series and parallel connection combinations for at least one semiconductor light-emitting chip.

* * * * *